United States Patent [19]

Lee et al.

[11] 4,456,678

[45] Jun. 26, 1984

[54] HIGH RESOLUTION LITHOGRAPHIC RESIST OF NEGATIVE WORKING CATIONIC VINYL POLYMER

[75] Inventors: Kang I. Lee, Framingham; William Jensen, Waltham; Peter Cukor, Natick, all of Mass.

[73] Assignee: GTE Laboratories Incorporated, Waltham, Mass.

[21] Appl. No.: 481,611

[22] Filed: Apr. 4, 1983

Related U.S. Application Data

[63] Continuation-in-part of Ser. No. 255,936, Apr. 20, 1981, abandoned.

[51] Int. Cl.$^3$ ............................................... G03C 1/68
[52] U.S. Cl. ............................ 430/279; 430/271; 430/296; 430/322; 204/159.22; 525/336; 526/248; 526/265; 526/259
[58] Field of Search ................. 526/265, 248, 258; 430/270, 281, 296, 322, 271; 204/159, 22

[56] References Cited

U.S. PATENT DOCUMENTS

| | | | |
|---|---|---|---|
| 2,732,350 | 1/1956 | Clarke | 260/2.1 |
| 3,682,339 | 8/1972 | Webster et al. | 526/265 |
| 3,936,429 | 2/1976 | Seoka et al. | 260/79.3 M |
| 4,046,766 | 9/1977 | Costin | 526/259 |
| 4,322,489 | 3/1982 | Land et al. | 526/265 |

OTHER PUBLICATIONS

Ohnishi, J. Vac. Sci. Technol. 19(4), Dec./1981, pp. 1136-1140.

Primary Examiner—Jack P. Brammer
Attorney, Agent, or Firm—Ivan L. Ericson

[57] ABSTRACT

A negative working resist composition and medium for microlithographic recording comprises a vinyl polymer having aromatic quaternized nitrogen-containing pendant groups. The resist undergoes a transformation from high to low solubility in polar solvents such as water or low molecular weight alcohols upon exposure to electron beams, ultraviolet light, or X-rays. A method for patterning substrates by employing the resist composition is also disclosed.

25 Claims, 2 Drawing Figures

HIGH RESOLUTION LITHOGRAPHIC RESIST OF NEGATIVE WORKING CATIONIC VINYL POLYMER

CROSS-REFERENCE TO RELATED APPLICATIONS

This application is a continuation-in-part of application Ser. No. 255,936 filed Apr. 20, 1981 now abandoned and assigned to the present assignee.

BACKGROUND OF THE INVENTION

This invention relates to resist compositions for high resolution electron beam lithography. More particularly, it is concerned with electron beam resist compositions, media for electron beam lithography, and a method for electron beam lithography, all based upon ionic polymers.

Photolithography has been employed for some time in the electronics industry for the production of circuit patterns. In known processes, a layer of resist material is applied to the substrate and patterned by exposure to light through a mask which defines the desired pattern. Upon exposure to light, the photoresist changes solubility, becoming either more soluble (positive working resist) or less soluble (negative working resist) in the developer solvent.

Most known positive working resists are polymeric materials which undergo a degradative reaction upon exposure to yield products which are more soluble in the developer solvent. Because most positive working resists function by this mechanism, they tend to be less sensitive than negative working resists. Negative resists generally function by a mechanism involving a radiation-induced increase in molecular weight, usually as a result of cross-linking, to produce a change in solubility. Negative working resists are generally preferred because of their greater sensitivity, but often exhibit undesirable swelling upon development due to cross-linking and entrapment of solvent in the cross-linked polymer net. Swelling can be a serious problem in applications which require high resolution.

In the production of integrated electronic circuit devices by microlithography, designs trends are toward increasing the scale of device complexity, and hence the density of circuit patterns, to reduce fabrication costs and increase performance. This goal imposes a number of requirements upon lithographic resist materials employed in the manufacture of such devices, notably resolution, sensitivity and etch resistance.

With increasing miniaturization of circuit patterns, the limit of usefulness of optical means for exposure imposed by unwanted diffraction effects is rapidly being approached. Electron beam lithography recently has found increased use in the production of microcircuit devices. Electron beams, by virtue of their shorter effective wavelength and increased depth of focus, can record information at higher densities and resolution than can light beams. The increasing use of electron beam lithography has spurred recent interest in the search for suitable electron beam resist materials. While some photoresist materials can also be used for electron beam lithography, most cannot. Moreover, since many known electron beam resists are positive working and do not have the sensitivity or etch resistance of negative working resists, the latter are preferred.

SUMMARY OF THE INVENTION

In accordance with the present invention, there are provided negative-working cationic polymer resist materials having good sensitivity, contrast, and etch resistance comprising vinyl polymers having aromatic quaternized nitrogen-containing heterocyclic pendant groups.

A recording medium for microlithographic recording comprises a film of cationic polymer resist material deposited on a substrate. The cationic polymer resist material comprises a vinyl polymer having aromatic quaternized nitrogen-containing heterocyclic pendant groups.

Figure 1:
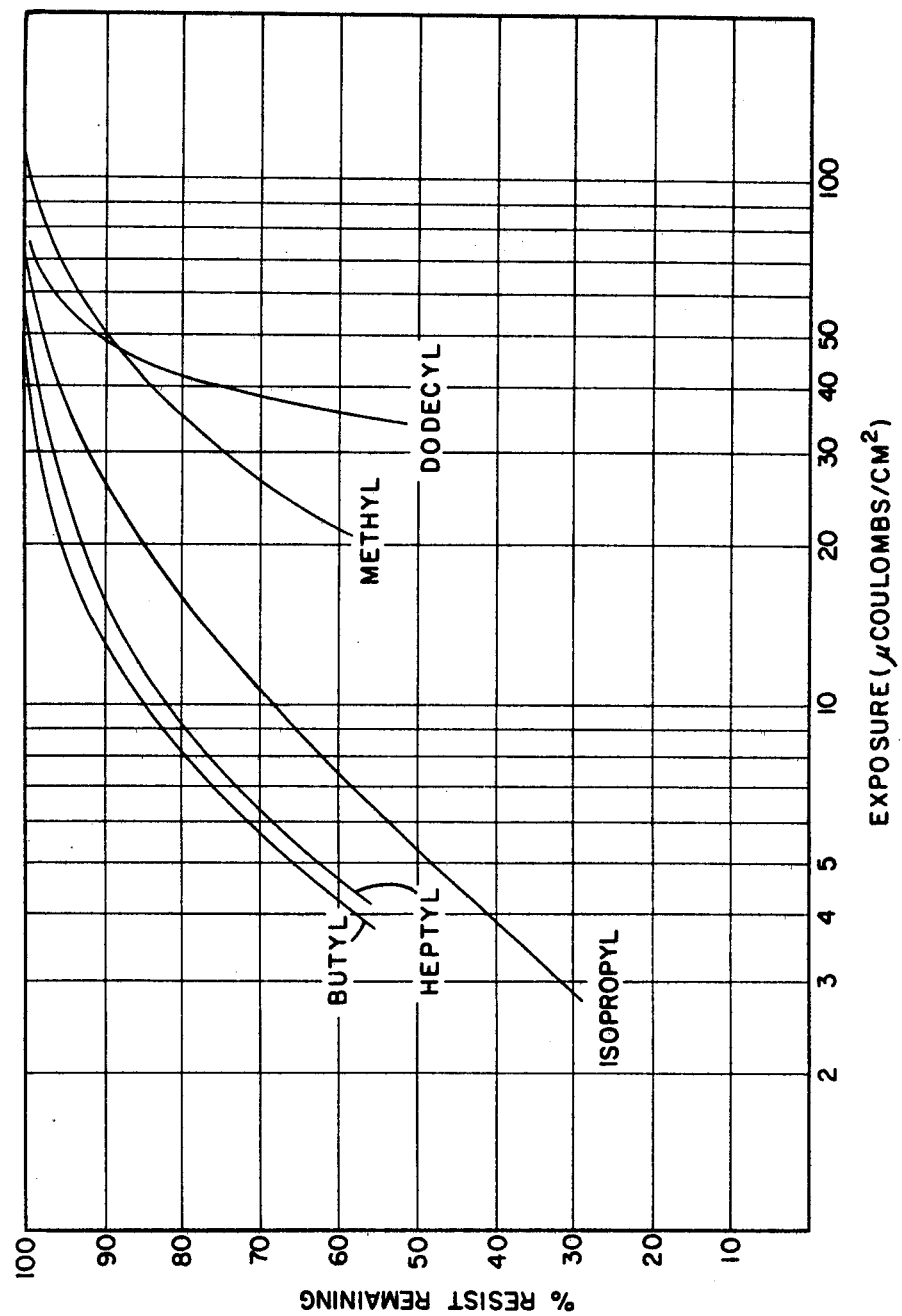
FIG. 1 is a graph showing the sensitivity to electron beam exposure of several cationic polymer resist materials in accordance with the invention.

For a better understanding of the invention, together with other and further objects, advantages, and capabilities thereof, reference is made to the following disclosure and appended claims in connection with the above-described drawing.

DETAILED DESCRIPTION

Cationic polymers useful in microlithographic recording resists in the present invention are polymers having a polyvinyl chain with cationic pendant groups. Pendant groups having aromatic ring systems have been found to be particularly stable to attack by etchants. Preferred cationic polymers of this invention are vinyl polymers having nitrogen-containing aromatic heterocyclic ring pendant groups. As used throughout this specification and appended claims, the term "aromatic" is meant to denote any cyclic system of atoms having a delocalized pi-electron structure satisfying Huckel's Rule and having exceptional stability resulting from such electron delocalization (cf. James B. Hendrickson et al., *Organic Chemistry*, 3rd Edition, McGraw-Hill, New York, 1970, pp. 167–170).

Examples of quaternized aromatic nitrogen-containing heterocyclic systems contemplated as falling within the scope of this invention and useful as pendant groups include, but are not necessarily limited to, monocyclic systems such as:

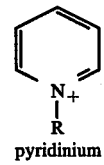
pyridinium

1,2-diazinium

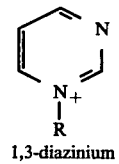
1,3-diazinium

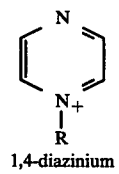
1,4-diazinium and condensed polycyclic systems such as:

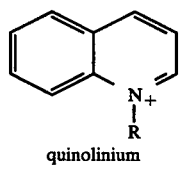
quinolinium

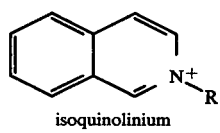
isoquinolinium

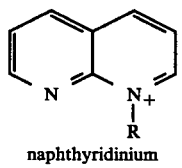
naphthyridinium

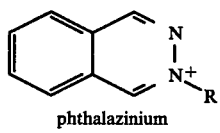
phthalazinium

quinoxalinium

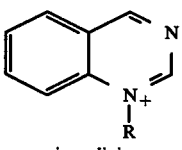
quinazolinium

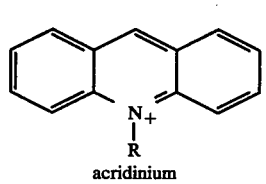
acridinium

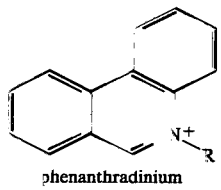
phenanthradinium

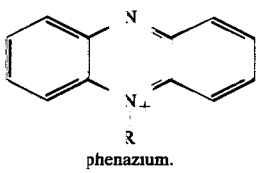
phenazium.

While shown as unsubstituted ring systems above, pendant groups having small alkyl group ring substituents such as methyl, ethyl, propyl, isopropyl and butyl groups or the like attached to carbon atoms of the ring systems are also contemplated as falling within the scope of the present invention.

Cationic polymer resists in accordance with this invention having pendant groups of the types mentioned above are soluble in solvents of high dipole moment such as water or low molecular weight alcohols because of the electrical charge associated with the quaternized nitrogen atom. Solvents such as water, mathanol, ethanol, propanol, isopropanol and the like thus serve as effective developer solvents. There is, however, a decrease in such solubility as the carbon content of the pendant group increases from monocyclic to tercyclic systems, or when such ring systems are substituted with alkyl side chains. Thus, for better solubility of the polymeric resist material in its charged quaternized form, unsubstituted monocyclic pendant groups such as pyridinium or diazinium are preferred. Because of superior etch resistance and ease of formulation, cationic polymer resist compositions having pendant pyridinium groups are most preferred.

In the formulas indicated above, R is hydrogen or an alkyl group containing from 1 to 12 carbon atoms, inclusive. For reasons already stated, there is decrease in solubility of the cationic polymer resist materials of this invention as the carbon content of the alkyl group attached to the quaternized nitrogen atom increases. Smaller R groups such as hydrogen or alkyl groups containing up to about 5 carbon atoms are thus preferred.

In cationic polymer resists of the present invention, the positive charge of the quaternized nitrogen atom is balanced by a negatively charged counter ion, preferably a halide ion or halogen-containing ion such as $F^-$, $Cl^-$, $Br^-$, $I^-$ or $PF_6^-$. Cationic polymer resist materials in accordance with the present invention are conveniently prepared by polymerization of the appropriate vinyl monomer followed by reaction of the resulting molecular polymer with a halogen-containing acid or an alkyl halide to produce the quaternized nitrogen cationic polymer. Details of the preparation of several poly (vinyl-N-alkylpyridinium salt) cationic polymers are given as illustrative examples below.

Cationic polymer resist materials of this invention undergo a substantial change in solubility in solvents of high dipole moment, such as water or low molecular weight alcohols, upon exposure to actinic radiation such as ultraviolet light, x-ray, or electron beam. Although the exact mechanism of the change is not well understood, and no theory is adhered to at the exclusion of others, it is believed that the change is attributed to a change in the polar character of the polymer from a charged form to an uncharged or neutral form. As detailed below in Example XIX and shown in FIG. 2, the resist materials undergo a change in their ultraviolet spectrum upon irradiation by electron beams, indicating the formation of a less polar species.

In this manner, the resist compositions of the present invention differ from prior art negative working resist materials which function by a change in molecular weight, usually due to cross-linking, for a change in solubility. Resist compositions of the present invention thus undergo a transformation in kind, i.e. from ionic to non-ionic, upon exposure rather than a change in degree, i.e. a change in molecular weight, as is characteristic of most prior art negative-working resist compositions. As a result, the resist-compositions of this invention exhibit good contrast and differential solubility upon exposure.

The average molecular weight of cationic polymers useful as resist compositions herein ranges between about 5000 to about 100,000. Because of the charge associated with each monomer unit of the cationic polymers, there seems to be little effect upon the solubility in polar solvents as the molecular weight of the polymer varies. For particular applications, the molecular weight range is tailored to obtain desirable film-forming qualities of the polymers.

To prepare microlithographic recording media of the invention, a solution of the polymer in water or a low molecular weight alcohol such as methanol is cast or spun on a substrate to obtain a thin uniform film. After depositing the solution on the substrate, which may be any conventional lithographic support such as glass, plastic, silicon substrates and the like, the solution is dried to yield a thin film of the polymer. Film thicknesses are varied to suit the particular application, but films of up to about 1 $\mu$m in thickness are effective as microlithographic recording media. Solutions of about 2 weight percent to about 10 weight percent cationic polymer in water or alcohol are effective in producing dried films of adequate thickness.

Following the casting and drying of the polymer film on the substrate, the film is exposed to actinic radiation. The method of exposure may be by flooding the cast film with the radiation through a patterned mask to replicate the pattern in the exposed film, or by tracing out the desired pattern by exposure to an electron beam controllably deflected to produce the pattern in the film. Exposure may be by ultraviolet light, x-ray, or electron beam in the cases of flood exposure through a pattern mask, or by deflected tight electron beam in the case where the pattern is traced. Examples XII–XVII below illustrate the effectiveness of several poly (2-vinyl-N-alkylpyridinium iodide) resists in accordance with the invention when exposed by ultraviolet light and electron beam.

In a preferred embodiment of the invention, cationic polymer resists are exposed by electron beam in a vector scanning electron microscope. This method yields the requisite resolution and density of pattern to produce very large scale integrated electronic circuit patterns on substrates.

Figure 2:
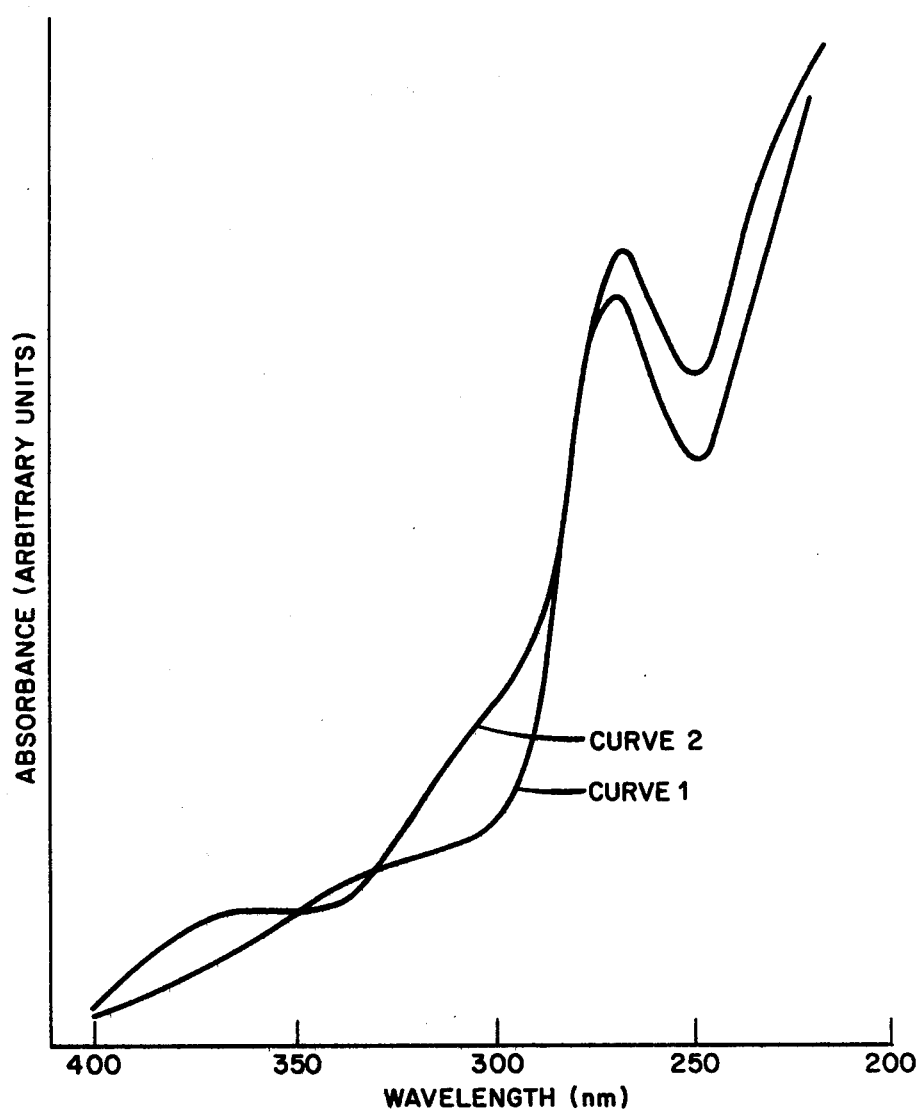
FIG. 2 is a graph showing the ultraviolet absorption spectra of a resist material in accordance with the present invention before and after exposure to electron beam irradiation.

As shown by Examples XIII–XVIII and illustrated in FIG. 2, exposure of several poly (vinyl-N-alkyl-pyridinium iodide) resist materials of this invention to a 20 kV electron beam with current densities ranging up to about 50 $\mu$coulombs/cm$^2$ were sufficient to insolubilize better than 70% of the resist film applied initially to the substrate in each case. In particular cases, exposures at much lower levels were effective.

Following exposure of the polymer film, the unexposed portion of cationic polymer film is removed by washing the substrate and film in a developer solvent of high dipole moment. Water, methanol, or other low molecular weight alcohols or organic solvents having a dipole moment greater than about 1.5 D are effective in removing the unexposed cationic polymer film while leaving the major amount of exposed film on the substrate.

Regions of the substrate not covered by the resist film remaining on the substrate are next processed to produce a pattern in the substrate. In the particular application where etched microelectronic circuit patterns are produced in a metallic substrate, the etching step may be carried out by plasma etching. The cationic polymer resists of this invention are particularly stable to attack by plasma arc as illustrated by Example XVIII where the etch resistance of poly (2-vinyl-N-methylpyridinium iodide) in accordance with the invention is compared to that of a prior art electron beam resist material noted for its etch resistance.

One surprising and beneficial aspect of cationic polymer resist materials of this invention is the apparent lack of any need to deposit an electrically conductive layer either over or under the polymer film when it is deposited on a substrate and employed as an electron beam resist. It is a common practice in electron beam lithography to deposit a thin film of electrically conductive material such as a metal film or a layer of tin oxide or indium oxide either over or under the electron beam resist to dissipate the charge which otherwise tends to build up in the resist film during electron beam exposure. If this charge is not removed, the possibility arises of electrostatic deflection or broadening of the electron beam at the point of impact on the film and substrate resulting in diminished resolution. Cationic polymer resist films of the present invention appear to have sufficient inherent electrical conductivity to carry away such charge during exposure, eliminating the need for the deposition of a metal or metal oxide film on the substrate. This desirable property of the resists of the invention simplifies the production of microelectronic circuit devices by eliminating several steps thereby in the overall process. Employing cationic polymer resist compositions of the present invention and electron beam lithographic methods, microelectronic circuit patterns have been obtained with sub-micron line widths and resolution.

In order to enable one skilled in the art to better practice the present invention, the following Examples are provided. It is to be understood, however, that the Examples are merely illustrative of the invention and are not to be viewed as limiting the scope thereof.

Examples I–XI illustrate methods of preparing cationic polymer resist compositions of the invention. In general, the methods include polymerization of the appropriately substituted vinyl monomer to produce a molecular polymer product. The molecular polymer is treated with a halogen-containing acid or an alkyl halide to quaternize the nitrogen atom of the aromatic nitrogen-containing heterocyclic pendant group to obtain the desired cationic polymer resist material.

EXAMPLE I

This Example illustrates the general method employed to produce molecular polymers used as intermediates in the formulation of cationic polymer resist compositions.

Thirty ml of freshly distilled vinyl pyridine were mixed with 0.2 g of benzoyl peroxide. The mixture was out-gassed by repeated freezing and thawing under vacuum in a liquid nitrogen bath. After the mixture had been thoroughly out-gassed, it was allowed to warm to room temperature and stand for 67 hours at 40° C. to polymerize.

At the end of this time the black residual mass was purified by repeated washing with tetrahydrofuran from which the polymer was precipitated each time with hexane or heptane. The final product has an off-white color.

EXAMPLE II

Five grams of poly(2-vinylpyridine) were dissolved in 50 ml of methylene chloride. To this mixture were added dropwise with stirring a solution of 11.39 g (0.08 mole) of methyl iodide dissolved in 10 ml of methylene chloride. The resulting mixture was stirred overnight at ambient temperature. At the end of this time the supernate was decanted from the rubbery mass of poly (2-vinyl-N-methylpyridinium iodide) which had precipitated from solution.

The product was dried in vacuum overnight. Differential scanning calorimetry of the produce indicated an endothermic melting transition point of 205° C. and a decomposition temperature of about 500° C.

EXAMPLE III

Poly(2-vinylpyridinium hydrochloride) was prepared by the general method detailed in Example II by reacting 4.8 g of poly(2-vinylpyridine) with 3.8 ml of 12 molar HCl.

EXAMPLE IV

Poly(2-vinylpyridinium hydrobromide) was prepared by the general method of Example II by reacting 5.0 g of poly(2-vinylpyridine) with 7.9 ml of 49 weight percent hydrobromic acid.

EXAMPLE V

Poly(2-vinylpyridinium hydrofluoride) was prepared by the general method detailed in Example II by reacting 1.1 g of poly(2-vinylpyridine) with 2 ml of about 48 weight percent hydrofluoric acid.

EXAMPLE VI

Poly(2-vinylpyridinium hexafluorophosphate) was prepared by the general method of Example II by reacting 1.14 g of poly(2-vinylpyridine) with 1.6 g of hexafluorophosphoric acid.

EXAMPLE VII

Poly(2-vinyl-N-ethylpyridinium iodide) was prepared by the general method of Example II by reacting 3.28 g of poly(2-vinylpyridine) with 4.88 g of ethyl iodide. It was found necessary to heat the methylene chloride solution under reflux for about 24 hours to insure reaction between the reagents.

EXAMPLE VIII

Poly(2-vinyl-N-propylpyridinium iodide) was prepared by reacting 5.2 g of poly(2-vinylpyridine) with 8.34 g of n-propyl iodide in methylene chloride. The cationic polymer product was precipitated from solution by addition of hexane.

EXAMPLE IX

Poly(2-vinyl-N-butylpyridinium bromide) was prepared by reacting 5.14 g of poly(2-vinylpyridine) with 6.70 g of 1-bromobutane in methylene chloride solution. The yellow cationic polymer product was precipitated from solution by the addition of cyclohexane.

EXAMPLE X

Poly(2-vinyl-N-heptylpyridinium iodide) was prepared by reacting 1.2 g of poly(vinylpyridine) with 2.65 g of 1-iodoheptane in methylene chloride solution. The methylene chloride solution was stirred at ambient temperatures overnight after which time it was heated under reflux for 2 hours. The polymer was separated by pouring the mixture into hexane. The resulting precipitate was dried under vacuum overnight.

EXAMPLE XI

Poly(2-vinyl-N-dodecylpyridinium iodide) was prepared by reacting 4.9 g of poly(2-vinylpyridine) with 13.8 g of dodecyl iodide in methylene chloride. The mixture was stirred at ambient temperatures for 4 days. After this time, the mixture was poured into hexane and the powdered polymeric product separated. The precipitated polymer was filtered and dried under vacuum overnight.

EXAMPLE XII

This example illustrates the use of cationic polymer resists of the present invention in processes employing ultraviolet light exposure.

A film of poly(2-vinyl-N-methylpyridinium iodide) approximately 8000 Ångstrom units in thickness was cast by conventional spinning techniques on a silicon wafer substrate. The solvent employed for film casting was distilled water. The coated wafer was dried and then exposed to ultraviolet light of 266 nm wavelength from a Nd:YAG pulsed laser. Following exposure, the coated, exposed silicon wafer was washed in distilled water. Measurement of the remaining film thickness indicated that most of the film originally cast on the wafer remained. A reflectance infrared spectrum of the exposed film remaining on the silicon substrate indicated that absorption bands at 1470 cm$^{-1}$ and 1435 cm$^{-1}$ were intensified relative to the band at 1512 cm$^{-1}$ compared with the pre-exposed film.

In Examples XIII–XVII following, shown in the table, the sensitivities to exposure by electron beam of several resist materials of this invention were evaluated. In each Example, a thin film of the appropriate resist material was cast on a 2 inch silicon wafer substrate which previously had been oxidized to produce a thin surface layer of SiO$_2$. The films were cast in each Example by applying a few drops of a methanolic solution of the resist and spinning at 2000 rpm to spread the film evenly over the substrate. Each cast film was dried by baking at 120° C. for about ½ hour.

Each coated silicon wafer was exposed to a 20 kV electron beam in a vector scan electron beam instrument which was computer controlled. Exposure produced a 9×9 array of rectangles each having a different exposure by varying the dwell time of the beam on each rectangle. The beam current was measured by means of a Faraday cup located in the instrument and a Keithley electrometer.

The approximate minimum exposure required to fix at least 70% of the resist material to the substrate appears in the Table. As the data indicate, exposure of the resists of this invention to an electron beam with current densities of up to about 50 coulombs/cm$^2$ is sufficient to fix at least 70% of the resist.

EXAMPLE XVIII

In this Example, the resistance to plasma etching of a resist material in accordance with the invention is compared to that of a prior art resist material employed for microelectronic circuit fabrication, known for its good etch resistance.

Two 2 inch silicon wafers were coated with electron beam resist materials. In one case, the resist was poly(2-vinyl-N-methylpyridinium iodide), and in the other case a prior art resist formulation. Both coated silicon substrates were exposed by methods detailed in Examples XIII–XVII above, and then developed to produce a pattern of resist material remaining on the substrate.

The two patterned substrates were then simultaneously etched in a plasma etcher for five minutes at 200 watts, 6% CCl$_4$ in He at 430 mTorr; five minutes at 150 watts, 4% CCl$_4$ in He at 420 mTorr; and 7 minutes at 50 watts, 10% O$_2$ in He at 480 mTorr.

TABLE

| Example | Resist Material | Casting Solvent | Exposure for 70% Retention of Resist ($\mu$ coulombs/CM$^2$) |
|---------|-----------------|-----------------|-----------------|
| XIII | Poly(2-vinyl-N—methylpyridinium iodide) | Water | ~100 |
| XIV | Poly(2-vinyl-N—isopropylpyridinium iodide) | Methanol | ~15 |
| XV | Poly(2-vinyl-N—butylpyridinium iodide) | Methanol | ~10 |
| XVI | Poly(2-vinyl-N—heptylpyridinium iodide) | Methanol | ~10 |
| XVII | Poly(2-vinyl-N—dodecylpyridinium iodide) | Methanol | ~40 |

Under these conditions, the prior art resist material was eroded at an average rate of about 120 Å/min and the resist of this invention at an average rate of about 60 Å/min.

EXAMPLE XIX

Two-tenths (0.2) gram of poly(2-vinyl-N-methylpyridinium) iodide were dissolved in 20 ml of distilled water and the solution was used to cast a thin film of the polymer on a quartz substrate by slowly evaporating the solution. The thickness of the polymer film on the quartz substrate was found to be 6200 Angstrom units (measured by a Nanospec film thickness monitor.)

The ultraviolet absorption spectrum of the film was measured and appears as Curve 1 in FIG. 2. The polymer film exhibited a strong absorption band around 275 nanometers due to pi-pi* electronic transitions. The case polymer film was next exposed to electron beam irradiation. Following exposure, the film was found to be quite insoluble in water. The measured ultraviolet absorption spectrum of the irradiated film, appearing in FIG. 2 as Curve 2, exhibits an absorption band around 370 nanometers not present in the ultraviolet absorption spectrum of the unirradiated film.

The absorption peak appearing at around 370 nanometers following irradiation by electron beam is attributed to a charge transfer reaction in the material resulting from the electron beam irradiation. The material was found to be quite insoluble in water following the irradiation, the insolubilization also being attributed to the charge transfer reaction taking place as a result of electron beam irradiation.

The polymeric materials of the present invention thus represent an advance in the state of the art of electron beam lithographic resist materials. Whereas prior art materials depend upon cross-linking or degradation of the material upon irradiation for a change in solubility, the materials of our invention undergo insolubilization upon irradiation by electron beams due to a charge transfer reaction. The distinct advantage that flows from this fact is the greatly increased resolution which is achievable through the use of the resist materials of our invention. When a lithographic resist material depends upon cross-linking or further polymerization to produce insolubilization, a certain amount of swelling of the resist material results. This swelling, in turn reduces the degree of resolution which can be achieved. In the current development of very large scale integrated circuit patterns on integrated circuit "chips", high resolution is not only desirable but necessary. The materials of our invention undergo insolubilization without detectable attendant swelling and are thus capable of high resolution.

Prior art resist materials which depend upon cross-linking or chemical degradation for a change in solubility generally require an unsaturated carbon-carbon linkage or similar reactive group sensitive to actinic radiation. On the contrary, the materials of our invention are capable of undergoing a charge transfer reaction, but are unreactive toward cross linking or further polymerization upon irradiation by electron beams because the chemical structures of the polymer resists of our invention are organic structures which are saturated (i.e. contain single bond carbon-carbon linkages, with the exception of the chemically stable aromatic nitrogen-containing heterocyclic rings.) The absence of unsaturation in the polymer resist materials of our invention is therefore believed to confer upon these materials stability toward electron beam induced cross-linking. These materials thus undergo a charge transfer reaction upon irradiation by electron beams rather than a classical cross-linking reaction.

While there have been shown and described what are at present considered the preferred embodiments of the invention, it will be obvious to those skilled in the art that various changes and modifications may be made therein without departing from the scope of the invention as defined by the appended claims.

What is claimed is:

1. A medium for electron beam lithographic recording comprising
   a substrate; and
   a solid film overlying said substrate, said solid film consisting essentially of a negative working cationic vinyl polymer resist consisting of a repeating unit

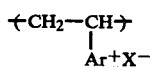

where Ar+ is selected from

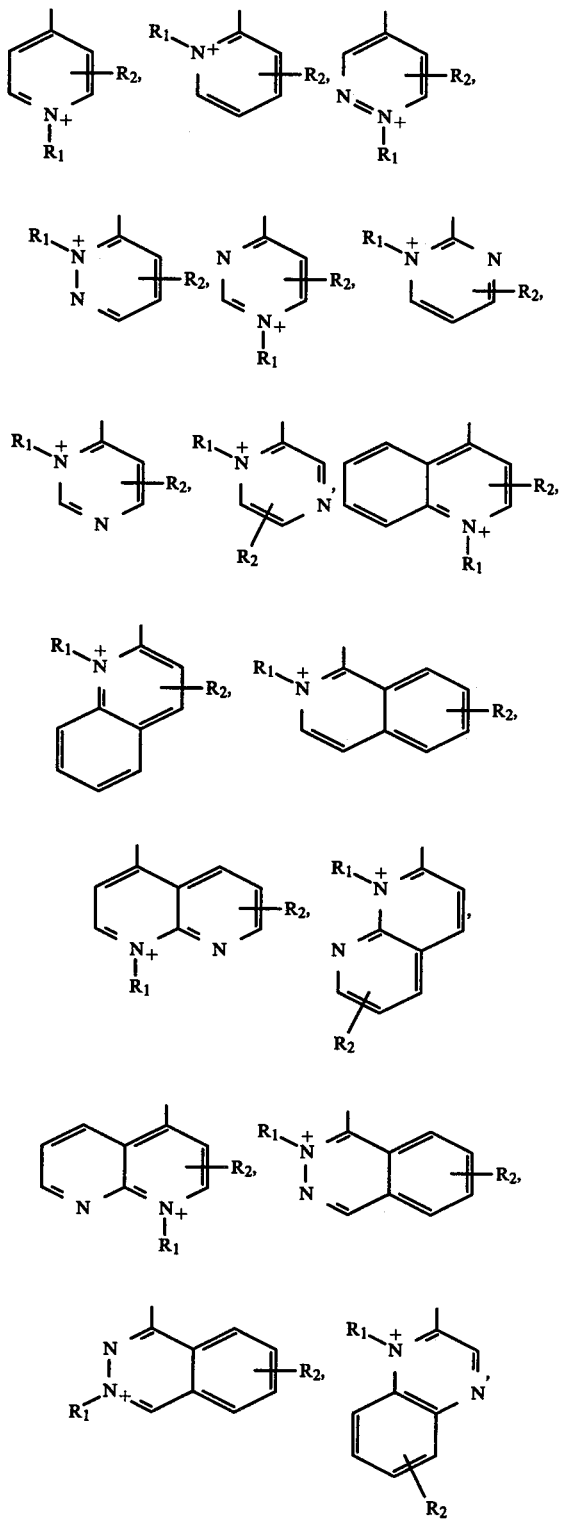

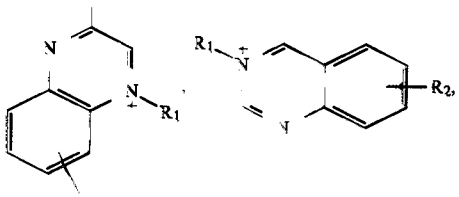

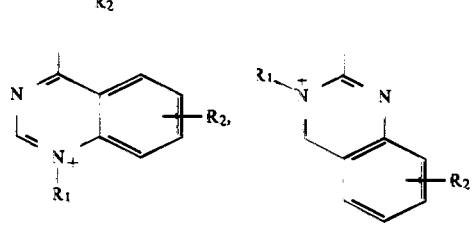

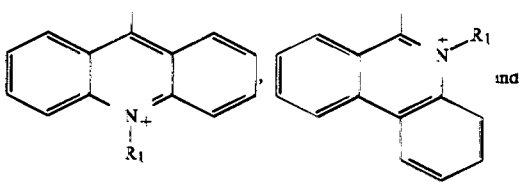

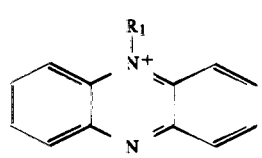

where $R_1$ is selected from hydrogen and $C_1$ to $C_{12}$ branched and unbranched alkyl radicals, $R_2$ is selected from hydrogen and $C_1$ to $C_4$ branched and unbranched alkyl radicals, and $X^-$ is selected from $F^-$, $Cl^-$, $Br^-$, $I^-$, or $PF_6^-$, said polymer having an average molecular weight from about 5,000 to about 1,000,000, and said resist being sensitive to electron beam irradiation and unreactive towards cross linking or further polymerization upon irradiation by said electron beams.

2. A medium for electron beam lithographic recording in accordance with claim 1 wherein said substrate comprises silicon.

3. A medium for electron beam lithographic recording in accordance with claim 1 wherein said polymer consists essentially of a poly(vinylpyridinium) salt.

4. A medium for electron beam lithograhic recording in accordance with claim 3 wherein said polymer consists essentially of a poly(2-vinyl-N-alkylpyridinium) salt.

5. A medium for electron beam lithographic recording in accordance with claim 3 wherein said polymer consists essentially of a poly(4-vinyl-N-alkylpyridinium) salt.

6. A medium for electron beam lithographic recording in accordance with claim 4 wherein $R_1$ is hydrogen.

7. A medium for electron beam lithographic recording in accordance with claim 4 wherein $R_1$ is methyl.

8. A medium for electron beam lithographic recording in accordance with claim 4 wherein $R_1$ is ethyl.

9. A medium for electron beam lithographic recording in accordance with claim 4 wherein $R_1$ is propyl.

10. A medium for electron beam lithographic recording in accordance with claim 4 wherein $R_1$ is isopropyl.

11. A medium for electron beam lithographic recording in accordance with claim 4 wherein $R_1$ is n-butyl.

12. A medium for electron beam lithographic recording in accordance with claim 4 wherein $R_1$ is n-heptyl.

13. A medium for electron beam lithographic recording in accordance with claim 4 wherein $R_1$ is n-dodecyl.

14. A medium for electron beam lithographic recording in accordance with claim 1 wherein said polymer consists essentially of a poly(vinyl-N-alkyl-1,2-diazinium) salt.

15. A medium for electron beam lithographic recording in accordance with claim 1 wherein said polymer consists essentially of a poly(vinyl-N-alkyl-1,3-diazinium) salt.

16. A medium for electron beam lithographic recording in accordance with claim 1 wherein said polymer consists essentially of a poly(vinyl-N-alkyl-1,4-diazinium) salt.

17. A medium for electron beam lithographic recording in accordance with claim 1 wherein said polymer consists essentially of a poly(vinyl-N-alkylquinolinium) salt.

18. A medium for electron beam lithographic recording in accordance with claim 1 wherein said polymer consists essentially of a poly(vinyl-N-alkylisoquinolinium) salt.

19. A medium for electron beam lithographic recording in accordance with claim 1 wherein said polymer consists essentially of a poly(vinyl-N-alkylnaphthyridinium) salt.

20. A medium for electron beam lithographic recording in accordance with claim 1 wherein said polymer consists essentially of a poly(vinyl-N-alkylphthalazinium) salt.

21. A medium for electron beam lithographic recording in accordance with claim 1 wherein said polymer consists essentially of a poly(vinyl-N-alkylquinoxalinium) salt.

22. A medium for electron beam lithographic recording in accordance with claim 1 wherein said polymer consists essentially of a poly(vinyl-N-alkylquinazolinium) salt.

23. A medium for electron beam lithographic recording in accordance with claim 1 wherein said polymer consists essentially of a poly(vinyl-N-alkylacridinium) salt.

24. A medium for electron beam lithographic recording in accordance with claim 1 wherein said polymer consists essentially of a poly(vinyl-N-alkylphenanthradinium) salt.

25. A medium for electron beam lithographic recording in accordance with claim 2 wherein said polymer consists essentially of a poly(vinyl-N-alkylphenaxium) salt.

* * * * *